United States Patent [19]

Peregrim et al.

[11] Patent Number: 5,001,297
[45] Date of Patent: Mar. 19, 1991

[54] TRACK MOUNTED ELECTROMAGNETIC SHIELDING DEVICE

[75] Inventors: Walter A. Peregrim, Wilkes-Barre; William H. Stickney, Cresco; Ronald W. Brewer, Bushkill, all of Pa.

[73] Assignee: Instrument Specialties Company, Inc., Delaware Water Gap, Pa.

[21] Appl. No.: 355,752

[22] Filed: May 23, 1989

[51] Int. Cl.$^5$ .............................................. H05K 9/00
[52] U.S. Cl. .................................. 174/35 GC; 29/428
[58] Field of Search .......... 174/35 GC, 35 R, 35 MS; 24/293, 294, 295, 289; 29/428; 219/10.55 D, 10.55 R

[56] References Cited

U.S. PATENT DOCUMENTS

| | | |
|---|---|---|
| 2,825,042 | 2/1958 | Tollefson et al. |
| 2,844,644 | 7/1958 | Soule, Jr. |
| 3,277,230 | 10/1966 | Stickney et al. |
| 3,504,095 | 3/1970 | Robertson et al. |
| 3,904,810 | 9/1975 | Kraus. |
| 3,962,550 | 6/1976 | Kaiserswerth. |
| 4,623,752 | 11/1986 | Steen et al. |

OTHER PUBLICATIONS

IBM Technical Disclosure Bulletin, vol. 20, No. 1 (Jun. 1977), "Conductive Seal for Electromagnetic Shielding", Nuccio et al.

Primary Examiner—Leo P. Picard
Assistant Examiner—Bot Lee Ledynh
Attorney, Agent, or Firm—Burns, Doane, Swecker & Mathis

[57] ABSTRACT

An electromagnetic shielding device for use along gaps between relatively movable surfaces of doors, access panels, drawers, and cabinets, etc., includes an electrically conductive shielding strip formed of longitudinally arranged segments integrally connected by a carrier strip. Each segment is mounted on a corresponding segment of a mount track which is adapted to securely lock the shielding strip in place. The design of the electromagnetic shielding device of the present invention provides enhanced capabilities of electromagnetic shielding as well as improvements in structural rigidity and mechanical durability. The design also facilitates installation of shielding in confined areas and repair of damaged shielding.

13 Claims, 4 Drawing Sheets

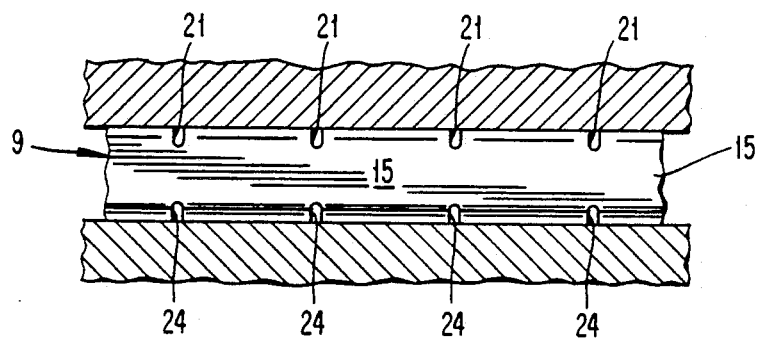
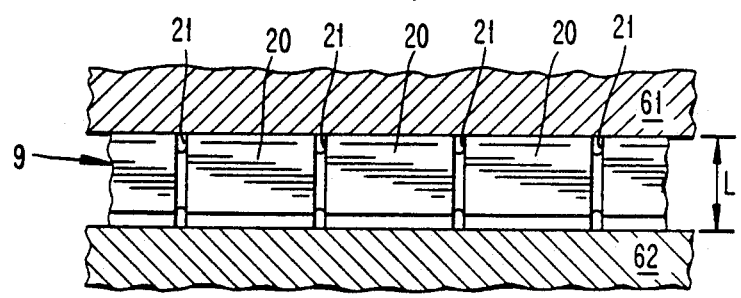
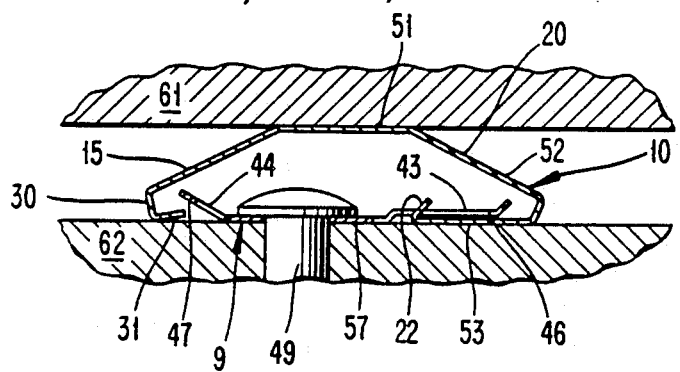

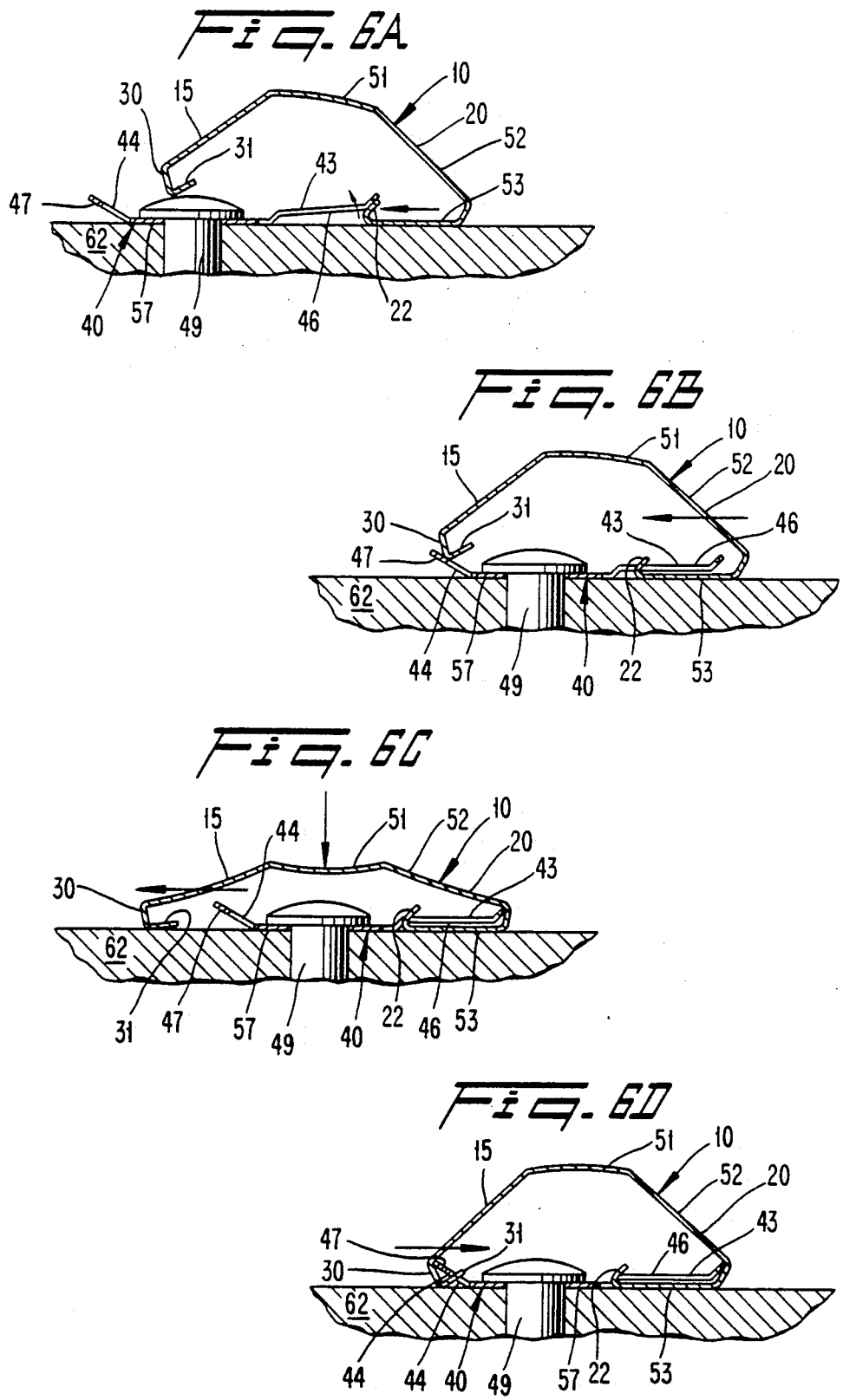

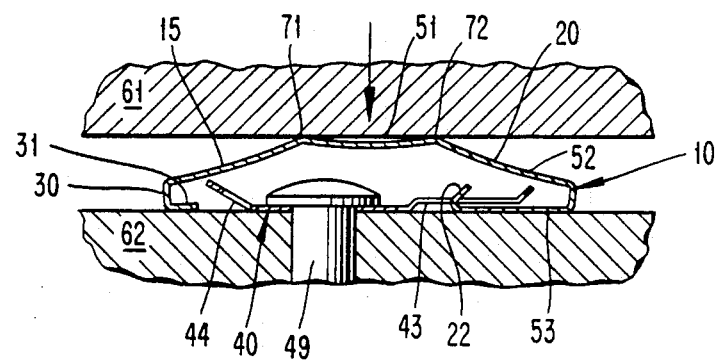
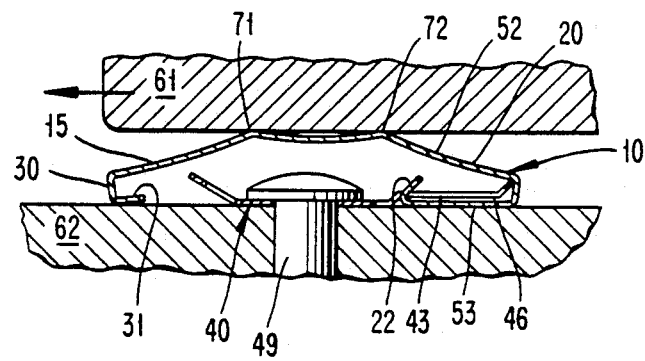
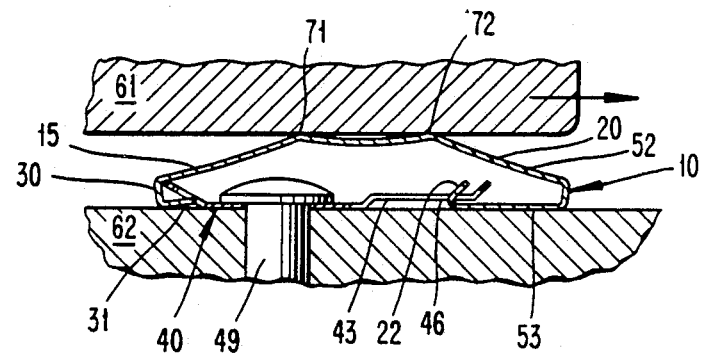

TRACK MOUNTED ELECTROMAGNETIC SHIELDING DEVICE

FIELD OF THE INVENTION

The present invention relates to electronic shielding devices and more particularly to electromagnetic shielding devices adapted to accommodate sliding as well as compressive closure members.

BACKGROUND OF THE INVENTION

Electromagnetic shielding is provided at joints between removable panels of housings for electronic equipment and testing facilities to impede transmission of electromagnetic fields. Optimally, the shielded item is isolated from the effects of external circuitry and other sources of electromagnetic disturbances. Electromagnetic shielding is often required for shielded enclosures such as, for example, doors of electronic laboratory rooms, casings of radio transmitters, receivers and computers and other similar facilities and equipment.

Commonly, such structures and equipment require shielding along gaps between surfaces of doors, access panels, drawers, cabinets or the like, where surfaces are repeatedly, or only possibly, moved relative to one another. For example, electrical components may be arranged individually in cases which are slid into and out of cabinets every time there arises a need to test, service or update the component. Accordingly, it is highly desirable for the casing to have electromagnetic shielding that is adapted to withstand the bi-directional shearing action induced upon it by each insertion and removal of the casing into and from the cabinet. Similarly, electrical components may be arranged in a compartment accessible only through a pivoting door which must be opened and closed each time there arises a need to test, service or update the component. As with the casings, it is highly desirable for the mating surfaces of the door to have electromagnetic shielding that is adapted to withstand the "wiping" action induced thereon during each pivot of the door. Failing such characteristics, the electromagnetic shielding of the electrical component may become broken and the component along with the entire electrical system to which it is connected becomes vulnerable to electromagnetic interference.

One prior shielding arrangement is disclosed in U.S. Pat. No. 3,504,095 issued Mar. 31, 1970 to Roberson et al. In a preferred embodiment, the Roberson patent discloses an electromagnetic gasket including a curved bearing portion and a longitudinal attaching portion connected to one side of the curved bearing portion. A plurality of notches divide the curved bearing portion into a row of integral fingers along the entire length of the gasket. These fingers have free ends which are capable of being snagged and/or bent excessively. Also, the other ends of the fingers are held rigidly in place relative to one of the shielded surfaces so that the gasket offers more resistance to shear or "wiping" in one transverse direction than in the opposite one.

Another prior shielding arrangement is disclosed in U.S. Pat. No. 3,277,230, issued on Oct. 4, 1966 to Stickney et al. The Stickney et al. patent discloses an electronic shielding gasket that includes a linear metallic strip having a central portion with spaced holes for receiving a special fastening device and fingers extending outwardly in rows from opposite edges of the central portion of the gasket. The free ends of both rows of fingers are left exposed and unprotected from being snagged upon one of the surfaces to be shielded when the surfaces are slid transversely relative to each other and to the gasket. Mounting of the Stickney et al. gasket also requires a relatively substantial amount of space due to the lateral extension of the fingers in opposite directions.

Other types of electromagnetic shielding arrangements, including those with longitudinal or circular strips arranged upon one of the opposed surfaces, are disclosed in U.S. Pat. Nos. 2,825,042 issued Feb. 25, 1958 to Tollefson et al.; 2,844,644 issued July 22, 1958 to Soule Jr.; and 3,904,810 issued Sept. 9, 1975 to Kraus.

Another known joint seal for electromagnetic wave shielding includes contact springs having a generally V shaped cross-section and providing an electromagnetic seal between a pair of movable members. The contact springs extend from one movable member at equal angles from beneath a clamp which is attached to the movable member. An arrangement of this type is disclosed in U.S. Pat. No. 3,962,550 issued June 8, 1976 to Kaiserswerth. Being asymmetrical, the Kaiserswerth device is not well-suited to effect electromagnetic shielding between two members which slide bi-directionally with respect to each other.

In IBM Technical Disclosure Bulletin Vol. 20, No. 1, page 281 (June 1977), a conductive seal for electromagnetic shielding is disclosed which is usable between movable panel sections. The seal comprises a transversely arched rubber strip whose upper surface is laminated with a metal foil. The flattened longitudinal edges of the laminated rubber strip are held in place by a metal strip 6 having longitudinal edge regions curled upwardly about the longitudinal edges of the laminated rubber strip.

In the IBM arrangement, the longitudinal ends of the rubber strip are confined such that the compliant deflection of the assembly occurs almost entirely in the arched portion of the laminated rubber strip. Accordingly, it is desirable to have the laminated metal foil relatively thin and yet suitably bonded to the rubber layer so as to remain attached even under excessive and repeated deflection of the rubber strip.

In U.S. Pat. No. 4,623,752 issued to Steen et al. on Nov. 18, 1986, a double-action gasket assembly for EMI/RFI shielding is disclosed having an elongated, articulated structure mounted on a substantially planar carrier. The articulated structure is formed of segments having an arcuate section with opposed extensions bent toward each other to form a respective pair of coplanar sections. The carrier is situated beneath the arcuate section and is contiguous with the coplanar sections. The carrier includes a means for mounting the gasket assembly to a mounting surface such as the edge of a panel.

OBJECTS OF THE INVENTION

It is an object of the present invention to provide an electromagnetic shielding device suitable for use between opposing surfaces of two spaced apart members which slide by each other in two opposing directions such as in bi-directional sliding.

A further object of the present invention is to provide an electromagnetic shielding device which is effective to maintain good electrical contact between surfaces of two spaced apart members even after repeated bi-directional sliding motion between the members.

It is a further object of the present invention to provide an electromagnetic shielding device which is useful on a wide variety of electrically conductive surfaces and materials.

Still a further object of the present invention is to provide an electromagnetic shielding device which is not prone to wear from the repeated movements of members.

Yet another object of the present invention is to provide an electromagnetic shielding device that is positively retained upon a surface.

Yet still another object of the present invention is to provide an electromagnetic shielding device which is relatively inexpensive to manufacture and easy to install such that no special tools are required to effect installation.

Another object is to provide an electromagnetic shielding device which may be repeatedly compressed at severe shear angles and with great shear forces, yet will still provide effective electromagnetic shielding.

Still another object is to provide an electromagnetic shielding device which requires a minimum of space for its placement.

Yet another object is to provide an electromagnetic shielding device which permits repetitive insertion and removal of electrical component casings or the like into and from a cabinet or the like without compromising the electromagnetic shielding of same.

Still another object is to provide an electromagnetic shielding device which permits repetitive opening and closing of pivoting doors, access panels and the like to electrical component locations without compromising the electromagnetic shielding of same.

Yet another object is to provide an electomagnetic shielding device which includes a replaceable shielding element mounted on a shielding track.

These and other objects are accomplished by an electromagnetic shielding device in accordance with the present invention which includes an electrically conductive shielding strip having a plurality of longitudinally arranged segments integrally connected by a carrier strip. Each of the segments has a first shielding finger integrally connected to the carrier strip and a second shielding finger integrally connected to the carrier strip and the first shielding finger extends in an opposite transverse direction from the second shielding finger. The device according to the present invention also includes a means for mounting the shielding strip to a surface of a member intended for shielding and has a means for locking the first and second shielding fingers of the shielding strip when the shielding strip is in an unloaded position.

The carrier strip may be configured to form a first side of the shielding strip while an inclined portion of the first shielding finger may serve to form a second side of the shielding strip. In such a configuration, on the first side of the shielding strip, slits separating the second shielding fingers will extend only to the carrier strip whereas on the second side, the slits separating the first shielding fingers will extend the entire height of the shielding strip. The lesser extension of the slits on the first side of the shielding strip may enhance shielding of high frequency electromagnetic signals.

For retaining the shielding strip to the means for mounting, the first and second shielding strips may be configured with a retention tab and an anti-snag tab, respectively. The tabs may be adapted to engage the means for locking that is integrated into the means for mounting.

The means for mounting may include first and second retention fingers that correspond to the first and second shielding fingers and have respective retention slots for retaining the tabs of the first and second shielding fingers.

In order for the electromagnetic shielding device to provide enhanced shielding at high frequencies, a domed portion of the first shielding finger may be designed such that it acquires a substantially planar configuration under certain compressive loads between opposed surfaces. The domed portion may provide capacitive coupling between the two opposed surfaces.

BRIEF DESCRIPTION OF THE DRAWINGS

The preferred embodiments of the present invention will be described in greater detail with reference to the accompanying drawings, wherein like members bear like reference numerals and wherein:

FIG. 4 shows an elevational view of a first side of the electromagnetic shielding device of the present invention when compressed between two opposed members.

FIG. 5 shows an elevational view of a second side of the electromagnetic shielding device of the present invention when compressed between two opposed members, the second side being opposite to the first side shown in FIG. 4.

FIGS. 6A-6D show the successive steps of assembly for a preferred embodiment of the present invention.

FIGS. 7A-7C show the deflected position of the shielding strip under various force loading conditions.

FIG. 8 is a cross-sectional view of a preferred embodiment of the present invention under design loading conditions.

DETAILED DESCRIPTION OF A PREFERRED EMBODIMENT

Figure 1:
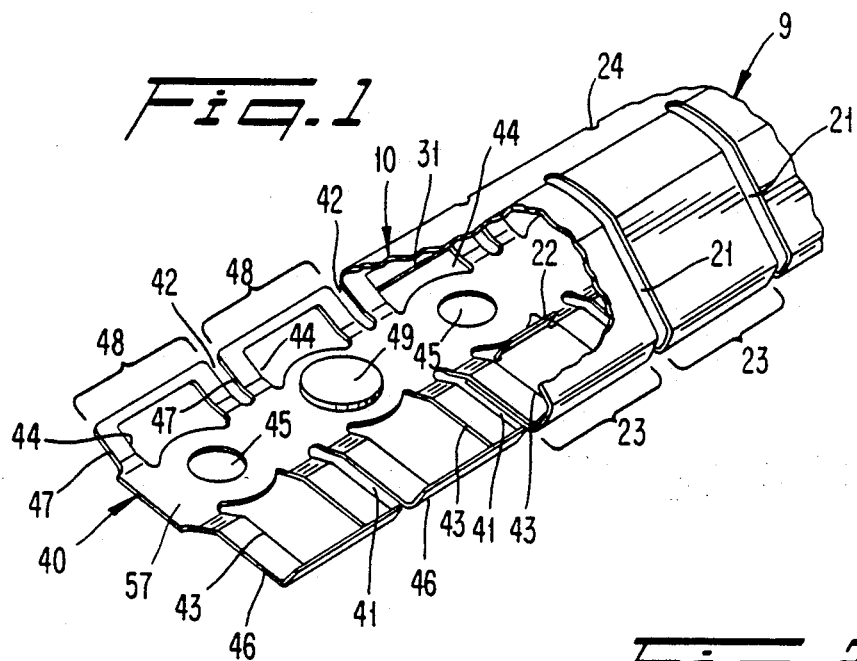
FIG. 1 is a cutaway perspective view of a preferred embodiment of the present invention.

Referring to FIG. 1, an electromagnetic shielding device 9 according to a preferred embodiment of the present invention is shown to include a shielding strip 10 secured to a mounting track 40. As shown in a typical arrangement between two surfaces in FIG. 2, the electromagnetic device 9 is attached to a member 62 by a fastening rivet 49 and oriented over a gap 63 such that the top portion of the electromagnetic shielding device 9 is in electrical contact with a member 61 and the bottom portion of the electromagnetic device is in electrical contact with a member 62. This resulting electrical contact across the gap 63 creates an electromagnetic shielding effect between the two members 61, 62.

Figure 3:
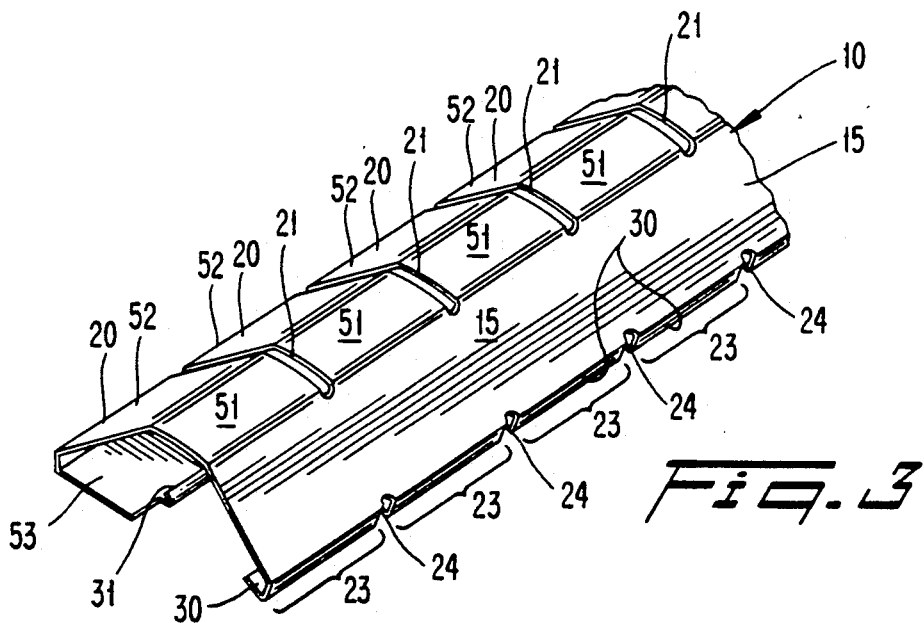
FIG. 3 shows a perspective view of the shielding strip of FIG. 1 from the opposite side.

The shielding strip 10 is shown in FIG. 3 as having a plurality of segments 23 that are integrally connected to one another by a solid carrier strip 15. The solid carrier strip 15 extends along the entire longitudinal length of the shielding strip 10. Each of the plurality of segments 23 includes a first shielding finger 20 and a second shielding finger 30. Both the first and second shielding finger 20, 30 in each segment 23 are connected to the solid carrier strip 15 and extend in opposite directions that are transverse from the longitudinal orientation of solid carrier strip 15.

The longitudinal stability of the shielding device 9 is, in part, a function of the solid carrier strip 15 since the strip 15 serves to discourage each of the shielding fingers both from flexing sideways and from twisting about an axis transverse to the longitudinally oriented strip 15. Such flexing may be otherwise induced on the fingers by the members 61, 62 shown in FIG. 2 should the members 61, 62 be caused to move relative to one another in the longitudinal direction of the shielding device 9, i.e., in a direction in or out of the paper when viewing FIG. 2. Such relative longitudinal movement of the members 61, 62 is typically seen when the members are serving as the closure surfaces of a pivoting door. For example, if the member 61 is a pivoting door, there will be relative movement in the longitudinal direction of the device 9 between the surfaces of the members 61 and 62 until the door is shut and secured to the member 62. That is, the door tends to "wipe" across its mating surface and urge undesired flexing and twisting of the fingers sandwiched therebetween until the door is closed.

The first shielding finger 20 of each segment 23 is separated from the first shielding finger 20 of an adjacent segment 23 by a slit 21. Similarly, the second shielding finger of each segment 23 is separated from the second shielding finger of an adjacent segment 23 by a slit 24. The slits on each side of the segment allows each segment thus to be independently flexible which consequently enhances the durability of the device 9.

Figure 2:
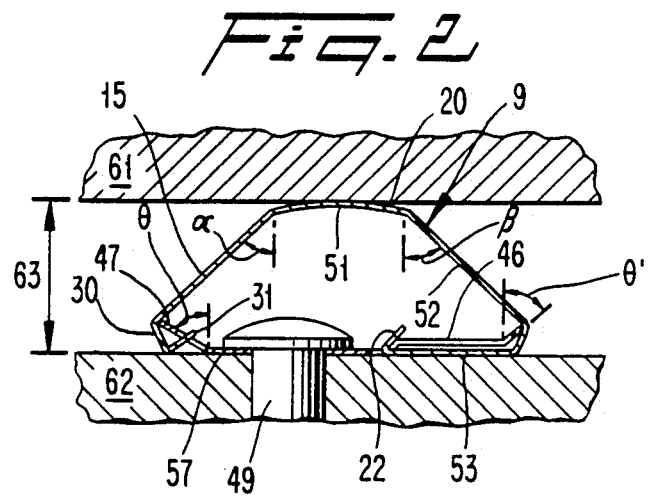
FIG. 2 is a cross-sectional view of a preferred embodiment of the electromagnetic device of the present invention between a pair of surfaces.

The solid carrier strip 15 is shown in FIG. 2 to be oriented at a given angle $\alpha$ from a vertical reference line and serves to provide a first side of the shielding strip. The first shielding finger 20, which is integrally connected with solid carrier strip 15, includes a domed portion 51, an inclined portion 52, and a planar portion 53. The domed portion 51 is situated adjacent to the solid carrier strip 15 and gently arches in a manner such that the apex of such an arch is the first point of contact with the member 61 when the member 61 is situated to compress the electromagnetic device 9. The domed portion 51 serves as a top surface of the electromagnetic shielding device 9. Inclined portion 52 is situated adjacent to the domed portion 51 and is inclined at an angle $\beta$ from a vertical reference line. Typically, angle $\beta$ will have substantially the same value as that of the angle $\alpha$ for the solid carrier strip 15. Inclined portion 52 forms a second side of the electromagnetic device 9. Planar portion 53 is situated adjacent to the inclined portion 52 and is oriented to curl from the inclined portion 52 such that a substantial portion thereof is positioned directly below both the inclined portion 52 and a segment of the domed portion 51. Planar portion 53 forms a bottom surface of the electromagnetic shielding device 9 that is substantially planar and substantially parallel to the top surface of the member 62. A retention tab 22 is situated at the terminating end of the planar portion 53. As is also shown in FIG. 2, second shielding finger 30 also extends from solid carrier strip 15 and has a U-shaped configuration which includes, at a terminating location, an anti-snag tab 31.

The shielding strip 10 as viewed from its first side, that is, as viewed from the side formed by the solid carrier strip 15, is depicted in FIG. 4. The slits 21 separating the first shielding finger of each of the plurality of segments 23 are located above the solid carrier strip 15. The slits 24 that separate the second shielding finger 30 of each of the plurality of segments 23 are located below the solid carrier strip 15.

The shielding strip 10 as viewed from the second side, that is, as viewed from the side of the electromagnetic shielding device 9 which is formed by the inclined portion 52 of the shielding finger 20 is depicted in FIG. 5. The slits 21, which separate the first finger 20 of each of the plurality of segments 23, extend the entire height L of the shielding strip 10. That is, the slits 21 extend over the entire gap 63 when the electromagnetic device 9 is mounted between the members 61 and 62 as shown in FIG. 2.

In configuring the first side of the shielding strip 10 with a solid carrier strip 15 such that there are no slits that extend the entire height of shielding strip 10 (as with the second side of the shielding strip 10), it is believed that the shielding characteristics of electromagnetic shielding device 9 are enhanced. High frequency electromagnetic waves are more effectively shielded since there are less openings available through which electromagnetic waves may pass.

The track mount 40 is depicted in FIG. 1 as having a plurality of segments 48, each of which corresponds to a segment 23 of the shielding strip 10 when the electromagnetic device 9 is assembled. Each of the segments 48 is integrally connected to an adjacent segment by a fastening strip 57 which extends along the longitudinal length of the track mount 40. At equally spaced intervals along the fastening strip 57 are located fastener holes 45. The holes are sized to accommodate fasteners that are generally known and available to those of ordinary skill in the art. Each of the segments 48 includes a first retention finger 46 and a second retention finger 47. Both the first and second retention fingers 46, 47 are integrally connected to the fastener strip 57 and extend opposite from each other in a direction transverse to the longitudinal length of the track mount 40. Additionally, the first and second retention fingers 46, 47 include retention slots 43, 44, respectively. The first retention finger 46 of each segment 48 is separated from the first retention finger 46 of an adjacent segment 48 by a slit 41. Similarly, the second retention finger 47 of each segment 48 is separated from the second retention finger 47 of each adjacent segment 48 by a slit 42.

As shown in FIG. 2, when track mount 40 is mounted to member 62 by a conventional fastener rivet 49, the fastener strip 57 is positioned parallel to and in contact with the top surface of member 62. It is further seen that the second retention finger 47 extends from fastener strip 57 at an angle $\Theta$ from a vertical reference line. The first retention finger 46 also extends from fastening strip 57, however, it is oriented such that a substantial portion thereof is configured to be parallel with the upper surface of the member 62 yet not in contact therewith. That is, a substantial portion of the first retention finger 47 is configured such that a slight gap is created between the first retention finger 46 and the upper surface of the member 62. As will be described below, the gap is substantially filled by the planar portion 53 of the first shielding finger 20 of the shielding strip 10 when the electromagnetic device 9 is assembled. The terminating end of the first retention finger 46 is configured at an angle $\Theta'$ from a vertical reference line. Typically, $\Theta'$ will have substantially the same value as that of the angle $\Theta$ for the second retention finger 47.

The shielding strip 10 is preferably made from a conductive metal alloy which may be easily shaped into the desired configuration without breakage. The entire shielding strip 10 is preferably formed from a single piece of an electrically conductive metal. A beryllium copper alloy has been found to be particularly amenable to the formation process. The thickness of the shielding strip is selected such that a desired degree of resiliency is obtained in the first and second fingers 20, 30 under the expected loads that are exerted by the compression of the member 61 onto the member 62.

The track mount 40 does not necessarily contribute to shielding and can be fabricated from any material that provides suitable flexibility for retaining the shielding strip 10. A material such as brass has been found to be appropriate. Other methods of construction and choice of materials for either the shielding strip 10 or the track mount 40 would be readily apparent to one of ordinary skill in the pertinent art.

Referring now to FIGS. 6A–6D, the assembly of one of the segments 23 of the shielding strip 10 onto one of the segments 48 of the track mount 40 as shown in FIG. 1 to form one of the segments of electromagnetic device 9 is discussed. It is understood that the assembly is identical for each segment of the device 9 and that an entire strip of segments can be assembled simultaneously or longitudinally sequentially As shown in FIG. 6A, the track mount 40 is attached by a rivet 49 to the upper surface of the member 62. It is noted that any suitable conventional fastener can be used to attach the track mount 40 to the member 62. The upper surface 62 may be the edge of a casing for an electronic component or the edge of a pivotable compartment door. It should be noted that, in the event it is undesirable to use a rivet to secure the track mount 40 to a surface, any suitably strong adhesive may be used instead. The adhesive is applied to the bottom surface of the fastening strip 57 and the track mount 40 is then placed onto the surface.

Once the track mount 40 is secured to the member 62, the shielding strip 10 is positioned adjacent to the track mount 40 such that the second shielding finger 30 is located above the the rivet 49 and above the fastening strip 57. The retention tab 22 of the first shielding finger 20 is situated just beneath the angled terminating portion of the first retention finger 46. In this position, the retention finger is deflected upward by the retention tab 22.

The shielding strip 10 is then moved transversely from its initial position of FIG. 6A to a position as shown in FIG. 6B such that the second shielding finger 30 is resting on the second retention finger 47. The planar portion 53 of the first shielding finger 20 has been moved such that it is now located within the gap existing between the first retention finger 46 and the upper surface of member 62. As shown in FIG. 1, in this position, the retention tab 22 is situated within the retention slot 43. Note that the retention slot 43 restrains the movement of the retention tab 22 both in the transverse and longitudinal directions.

After positioning the shielding strip as shown in FIG. 6B, downward pressure is then exerted on the domed portion 51 of the first shielding finger 20 as shown in FIG. 6C. This causes transverse deflection of the second shielding finger 30 such that the anti-snag tab 31 extends beyond and below the second retention finger 47.

Following the extension of the anti-snag tab 31, the downward force exerted on the domed portion 51 of the first shielding finger 20 is then released as shown in FIG. 6D. This allows the second finger 30 to transversely return to its undeflected position thus causing the anti-snag tab 31 to engage into the retention slot 44 as shown in FIG. 1. In the same manner as the retention slot 43 of the retention finger 53, the retention slot 44 restrains the anti-snag tab 31 in both the transverse and longitudinal direction.

In the above-described manner, one segment of the shielding strip 10 becomes secured to one segment of the track mount 40 to form one segment of the electromagnetic device 9. The number of segments assembled will be dictated by the intended application of the device 9, however, each segment is assembled in a like manner. Further, each segment can be assembled simultaneously or sequentially.

The electromagnetic shielding device 9 as assembled above includes a number of design features that facilitate and enhance the function thereof. First, due to the retention of the shielding fingers in both the transverse and longitudinal directions by the retention slots 43 and 44, stability and resistance to deflection is enhanced, especially when the device 9 is unloaded. This enhancement reduces the potential for damage due to snagging and the like which may occur during installation and normal use. The retention of the fingers also substantially reduces the potential of metallic pieces falling away from the device should the mechanical failure of a finger occur. In the event of such a mechancal failure of a finger, however, the segmented design allows easy replacement without significant loss of shielding integrity since broken segments can simply be cut from the shielding strip and replaced with new segments. The design is especially advantageous and convenient when the device 9 is required to be mounted around the edge of a door frame since the above-described assembly is achieved primarily by movement of the shielding strip in the transverse direction.

The various operating positions of the electromagnetic shielding device 9 as depicted in FIGS. 7A–7C will now be discussed. In FIG. 7A, the member 61 is shown compressing shielding strip 10 against the top surface of member 62. The member 61 may be the mating member of a case that serves as a housing for an electronic component or the mating member of a pivoting door to an electrical compartment. The compression force exerted by the member 61 causes the domed portion 51 of the first finger 20 to acquire a concave orientation such that the shielding strip 10 contacts the member 61 at two points 71 and 72. The compression force exerted by the member 61 also causes both the first shielding finger 20 and the second shielding finger 30 to extend outwardly in laterally opposite directions. While the anti-snag tab 31 is no longer retained in the slot 44 in this loaded state, the shielding strip 10 yet remains transversely and longitudinally stable as the retention tab 22 remains retained in slot 43.

FIG. 7B shows the effect on the shielding strip 10 when the member 61 is both compressed onto the strip 10 and moved transversely to the left relative to the member 62. Such relative motion would occur, for example, between the shielded surfaces of a case and a cabinet when the case is moved in and out to allow access for maintenance and repair, etc. of electrical components therein. The transverse leftward movement of the member 61 causes the shielding strip 10 to also translate transversely to the left but only to the extent of any clearance that may exist between the terminating portion of the retention finger 46 and the outwardmost portion of the first shielding finger 20. As discussed with respect to FIG. 7A, the anti-snag tab 31 is caused to disengage from the retention slot 44, however, the retention tab 22 maintains the transverse and longitudinal stability of the strip 10 as the retention tab 22 remains engaged in the slot 43.

In a similar manner, FIG. 7C shows the effect of rightward transverse movement of the member 61 relative to the member 62 on the shielding strip 10. The relative rightward movement of the member 61 causes the shielding strip 10 to also move rightwardly but only to the extent of the clearance between the second shielding finger 30 and the retention finger 47. The retention tab 22 of the first shielding finger 20 remains engaged captivated in the retention slot 43 and thus continues to provide suitable transverse and longitudinal stability to the shielding strip 10.

In view of FIGS. 7A–7C, it is noted that despite relative transverse movement that may occur between the members 61 and 62, due to the flexibility and continual retention of the shielding strip 10, effective electrical contact (and thus, effective electromagnetic shielding), is maintained.

It is noted that, in certain circumstances, the compression of the member 61 may be readily adjustable or controlled and, further, that a lesser compression force may be exerted on the domed portion 51 of the first shielding finger 20 than that previously discussed with respect to FIGS. 7A–7C. If such should be the case, instead of the domed portion 51 of the first finger 20 acquiring a concave configuration as shown in FIG. 7A, the domed portion 51 is designed to acquire a flat orientation as shown in FIG. 8. This resulting configuration is not unlike that of an electerical capacitor; the lesser compression force of member 61 causes the device 9 to acquire a geometery having essentially two parallel surfaces separated by a small gap. It is believed that this forms a capacitive coupling between the members 61, 62 that is especially effective for shielding electromagnetic waves at radio frequencies in the megahertz to gigahertz freqency range. The smaller the gap, the lower the frequency for which the device 9 becomes effective. Such a capacitive coupling is especially advantageous when the members have been coated with a cadmium chromate or similar corrosion inhibiting coatings for corrosion prevention and the resulting surfaces are semi-conductive.

The present invention provides a relatively simple yet highly effective device for electromagnetic shielding of two relatively movable surfaces. The device may be readily mounted to any type of surface and ensures proper electrical contact between two opposed surfaces, even during and after they are slid transversely past each other. Also, high frequency shielding is enhanced and structural rigidity reinforced by incorporating a solid shielding strip at one side of the shielding strip. Yet further, structural rigidity is maintained even during relative movement between members since at least one of the fingers of the shielding strip is longitudinally and laterally retained at all times.

The principles, a preferred embodiment and mode of operation of the present invention have been described in the foregoing specification. However, the invention which is intended to be protected is not to be construed as limited to the particular embodiment disclosed. The embodiment is therefore to be regarded as illustrative rather than restrictive. Variations and changes may be made by others without departing from the spirit of the present invention. Accordingly, it is expressly intended that all such equivalents, variations and changes which fall within the spirit and scope of the present invention as defined in the claims be embraced thereby.

What is claimed is:

1. An electromagnetic shielding device comprising:
    an electrically conductive shielding strip having a plurality of longitudinally arranged segments integrally connected by a carrier strip which extends along the longitudinal length of said shielding strip, each of said segments having a first shielding finger integrally connected to said carrier strip and a second shielding finger integrally connected to said carrier strip, said first shielding finger extending in an opposite transverse direction from said second shielding finger, and
    means for mounting said shielding strip to a surface of a member intended to be shielded, having means for locking each of said first and second shielding fingers of said shielding strip to said means for mounting when said shielding strip is in an unloaded condition and for locking each of said shielding second fingers of said shielding strip to said means for mounting when said shielding strip is in a loaded condition, to prevent longitudinal displacement between the shielding strip and the means for mounting in both loaded and unloaded conditions.

2. An electromagnetic shielding device according to claim 1,
    wherein said carrier strip is oriented at an angle inclined from vertical to form a first side of said shielding strip which side is substantially continuous and free of slots, and
    wherein said first shielding finger of each segment has a substantially domed portion adjacent said inclined carrier strip, a substantially inclined portion adjacent said substantially domed portion, and a substantially planar portion adjacent said substantially inclined portion, said substantially inclined portion of said first shielding finger formed a second slotted side of said shielding strip.

3. An electromagnetic shielding device according to claim 2, wherein the first shielding fingers of said plurality of segments are separated by a plurality of slits which, when viewed from said first side, extend the entire height of said shielding strip.

4. An electromagnetic shielding device according to claim 2, wherein the second shielding fingers of said plurality of segments are separated by a plurality of slits which, when viewed from said second side, extend up to said carrier strip.

5. An electromagnetic shielding device according to claim 2, wherein said second shielding finger has a U-shaped configuration.

6. An electromagnetic shielding device according to claim 2, wherein said first shielding finger includes a retention tab disposed at a terminating location of said first shielding finger and said second shielding finger includes an anti-snag tab disposed at a terminating location of said second shielding finger, said retention tab and said 7. An electromagnetic shielding device according to claim 2, wherein said domed portion of said first shielding finger is adapted to achieve a substantially planar configuration when said electromagnetic shielding device is compressed between two opposed surfaces.

8. An electromagnetic shielding device according to claim 7, wherein said substantially planar configuration causes said electromagnetic shielding device to achieve capacitive coupling between the two opposed surfaces.

9. An electromagnetic shielding device according to claim 1, wherein said means for locking said first and second shielding fingers prevents said shielding strip from sliding longitudinally relative to said means for mounting said shielding strip.

10. An electromagnetic shielding device comprising:
an electrically conductive shielding strip having a plurality of longitudinally arranged segments integrally connected by a carrier strip which extends along the longitudinal length of said shielding strip, each of said segments having a first shielding finger integrally connected to said carrier strip and a second shielding finger integrally connected to said carrier strip, said first shielding finger extending in an opposite transverse direction from said second shielding finger,
a means for mounting said shielding strip to a surface of a member intended for shielding having means for locking said first and second shielding fingers of said shielding strip when said shielding strip is in an unloaded position; wherein said carrier strip is oriented at an angle inclined from vertical to form a first side of said shielding strip and said first shielding finger of each segment has a substantially domed portion adjacent said inclined carrier strip, a substantially inclined portion adjacent said substantially domed portion and a substantially planar portion adjacent said substantially inclined portion, said substantially inclined portion of said first shielding finger forming a second side of said shielding strip, wherein said first shielding finger includes a retention tab disposed at a terminating location of said first shielding finger and said second shielding finger includes an anti-snag tab disposed at a terminating location of said second shielding finger, said retention tab and said anti-snag tab adapted to engage said means for locking said first and second shielding fingers, wherein said means for locking said first and second shielding fingers includes a first retention finger and a second retention finger corresponding to said first shielding finger and said second retention finger of said shielding strip, said first retention finger having a first retention slot for retaining said retention tab of said first shielding finger, said second retention finer having a second retention slot for retaining said anti-snag tab of said second shielding finger.

11. A method of assembling an electromagnetic shielding device comprising the steps of;
rigidly fastening a track mount to an upper surface of a member intended for shielding,
positioning a shielding strip adjacent to said track mount such that a second shielding finger of said shielding strip is situated above a fastener hole and above a fastening strip of said track mount, and such that a retention tab of a first shielding finger of said shielding strip is situated just beneath an angled terminating portion of said first retention finger,
moving said shielding strip in a direction transverse to the longitudinal direction of the shielding strip such that said second shielding finger comes to rest on a second retention finger of said track mount, and such that said first shielding finger becomes situated within a gap existing between said first retention finger and said upper surface of said member intended for shielding,
exerting downward pressure on a domed portion of said first finger such that said second shielding finger is transversely deflected such that an anti-snag tab disposed on said second shielding finger extends beyond and below said second retention finger,
releasing said downward pressure on said domed portion such that said second shielding finger transversely returns to an undeflected position wherein said anti-snag tab engages into a retention slot of said second retention finger.

12. An electromagnetic shielding device comprising:
an electrically conductive shielding strip having a plurality of longitudinally arranged segments integrally connected by a carrier strip which extends along the longitudinal length of said shielding strip, each of said segments having a first shielding finger integrally connected to said carrier strip and a second shielding finger integrally connected to said carrier strip, said first shielding finger extending in an opposite transverse direction from said second shielding finger,
a means for mounting said shielding strip to a surface of a member intended for shielding having means for locking said first and second shielding fingers of said shielding strip when said shielding strip is in an unloaded position; wherein said carrier strip is oriented at an angle inclined from vertical to form a first side of said shielding strip and said first shielding finger of each segment has a substantially domed portion adjacent said inclined carrier strip, a substantially inclined portion adjacent said substantially domed portion and a substantially planar portion adjacent said substantially inclined portion, said substantially inclined portion of said first shielding finger forming a second side of said shielding strip, wherein said means for mounting said shielding strip includes a plurality of longitudinally arranged segments integrally connected by a fastening strip which extends along the longitudinal length of said means for mounting, each of said segments corresponding to one of said segments of said carrier strip, each of said segments configured to include said means for locking said first and second shielding fingers, said means for locking including a first retention finger and a second retention finger corresponding respectively to said first shielding finger and said second shielding finger of said shielding strip, said first retention finger extending in an opposite transverse direction from said second retention finger, said first retention finger having a first retention slot, said second retention finger having a second retention slot, said first and second retention slots adapted to engage said first and second shielding fingers, respectively.

13. An electromagnetic shielding device comprising:
an elongated electrically conductive shielding strip having a length and having, in cross section,
a first inclined side,
a second inclined side, convergently disposed relative to the first inclined side,
a domed portion integrally connected with the first inclined side and the second inclined side,
a first generally flat portion connected with the first inclined side remote from the domed portion, and a second generally flat portion connected with the second inclined side remote from the domed portion and aligned with the first generally flat portion;

the first inclined side of the elongated electrically conductive shielding strip being essentially continuous along the length of the strip;

the domed portion, the second generally inclined side, and the second generally flat portion being integrally connected and separated by transverse slits along the length of the strip so as to define first fingers spaced along the length of the strip;

the second generally flat portion being separated by other transverse slits along the length of the strip so as to define second fingers spaced along the length of the strip; and means for mounting the strip between opposed surfaces such that the domed portion engages one surface and the first and second generally flat portions engage the other surface;

whereby the essentially continuous first side reduces direct electromagnetic radiation at high frequency between the opposed surfaces and whereby the essentially continuous first side reduces the self inductance of the fingers and decreases electrical impedance between the opposed surfaces.

* * * * *